United States Patent
Smooha

[19]

[11] Patent Number: 5,838,033
[45] Date of Patent: Nov. 17, 1998

[54] INTEGRATED CIRCUIT WITH GATE CONDUCTOR DEFINED RESISTOR

[75] Inventor: Yehuda Smooha, South Whitehall Township, Pa.

[73] Assignee: Lucent Technologies Inc., Murray Hill, N.J.

[21] Appl. No.: 118,109

[22] Filed: Sep. 8, 1993

[51] Int. Cl.$^6$ .................................................. H01L 29/76
[52] U.S. Cl. ............................................................ 257/213
[58] Field of Search ............................................. 257/213

[56] References Cited

U.S. PATENT DOCUMENTS

| | | | |
|---|---|---|---|
| 4,717,684 | 1/1988 | Hinode et al. | 437/34 |
| 4,806,999 | 2/1989 | Strauss | 357/23.13 |
| 4,821,089 | 4/1989 | Strauss | 357/68 |
| 4,830,976 | 5/1989 | Morris | 437/47 |
| 4,990,802 | 2/1991 | Smooha | 307/482.1 |
| 5,051,860 | 9/1991 | Lee et al. | 361/58 |
| 5,157,573 | 10/1992 | Lee | 361/56 |

*Primary Examiner*—Stephen Meier
*Attorney, Agent, or Firm*—James H. Fox

[57] ABSTRACT

A doped semiconductor distributed resistor is placed in series with the drain of a field effect transistor, typically for electrostatic discharge protection of an integrated circuit. The resistor is defined with a mask formed from the same conductor layer (e.g., polysilicon) that forms the transistor gate conductor. To avoid a floating gate, the conductor mask may be tied to the associated output bondpad. The advantages of using a gate conductor-defined resistor as compared to the prior-art practice includes better control of the resistor dimensions. Hence, the overall size of the output transistor and resistor may be reduced as compared to prior-art techniques, while achieving a high level of ESD protection.

6 Claims, 3 Drawing Sheets

INTEGRATED CIRCUIT WITH GATE CONDUCTOR DEFINED RESISTOR

BACKGROUND OF THE INVENTION

1. Field of the Invention

The present invention concerns an integrated circuit having a resistor, and a method of making it.

2. Description of the Prior Art

The protection of integrated circuit (IC) output buffers from electrostatic discharge (ESD) events has received considerable design attention, especially as IC dimensions shrink. The ESD events are typically conducted to the IC through the output, or input/output (I/O) bondpads, which connect the IC to external package terminals via wirebonds or TABs (tape automated bonding). In some cases, the ICs are connected directly to printed circuit conductors via the bondpads, as with multi-chip modules (MCMs). The ICs may be exposed to ESD events before the packaging operation, but more typically are exposed to ESD events after packaging, as during shipping or handling operations. It is known that the n-channel output transistors are particularly susceptible to ESD damage, at least in typical present-day CMOS (complementary metal oxide semiconductor) fabrication processes, although protection of p-channel devices may also be required. The design techniques used to protect output buffers from ESD include the use of output resistors and/or voltage clamping devices such as diodes or transistors. Various types of voltage clamping devices are known in the art, with useful designs being shown, for example, in U.S. Pat. Nos. 4,821,089 and 4,806,999 coassigned herewith. These devices serve to limit the maximum voltage that appears at the drain electrode of one or more output transistors. One form of ESD protection, wherein a polysilicon or silicide output resistor is used in conjunction with voltage clamping means, is described in U.S. Pat. No. 4,990,802 coassigned herewith.

Another type of output resistor is formed in a doped semiconductor layer, and is often referred to as a "diffused resistor". For example, FIG. 1 illustrates an n-channel output transistor comprising a gate dielectric 105 and gate conductor 106 formed on a p-substrate region 100. An n+ source region 104 is connected to a power supply conductor ($V_{SS}$, or alternatively $V_{DD}$). An n+ drain region 103 is connected to a bondpad 106 through an n-tub region 101 and an n+ tub contact region 102. The n-tub region 101 provides a resistance between the drain region 103 and the tub contact region 102. However, the regions 103 and 102 provide relatively little resistance due to their high doping levels, and practically no resistance if a silicide layer (not shown) is present. The length of the n-tub resistor is determined by the size of the field oxide region 107, which serves as a mask when performing the n+ ion-implantation step (or other type of dopant diffusion operation) that forms the n+ regions 102, 103 and 104. The field oxide region 107 may be formed by oxide growth techniques known in the art. However, the resistance provided by the n-tub diffused resistor defined by the field oxide region 107 is typically not well controlled, due to variations in the length L of the field oxide. These variations cause the circuit designer to provide for "worst case" performance, which can lead to an increase in the size of the output transistor. Furthermore, the length L of the oxide is usually larger than the minimum lithographic size (typically equal to the length of gate conductor 106), due to the well-known "birds beak" effect that extends the length of grown oxide regions. Therefore, the size of the resistor is often undesirably increased also.

Another technique for forming a diffused output resistor is shown in FIG. 2, wherein the output transistor includes a gate dielectric 207 and gate conductor 208 formed over p-substrate 200. Note that this transistor also includes sidewall oxide regions 209 and 210, which are formed by oxide deposition and anisotropic etching techniques known in the art. The sidewall oxide regions 209 and 210 provide a mask over the previously-implanted n-regions 204 and 205, which serve as the lightly doped drain (LDD) regions in the well-known LDD process. Therefore, the sidewalls prevent LDD regions 204 and 205 from being doped with the n+ dopant when the n+ source/drain regions 203 and 206, and tub contact region 202, are formed by ion implantation. The diffused resistor in this technique comprises the lightly-doped n− region 201 that is similarly masked by the deposited oxide region 212 and the thin oxide region 211, with the latter being grown at the same time as the gate oxide region 207. The oxide region 212 is deposited in the same step as the sidewall oxide regions 209 and 210. However, this resistor-forming technique requires that an extra lithography step be performed in order to define the oxide regions 211 and 212, since the sidewall oxide regions themselves are formed by an anisotropic etch that requires no lithographic step. Furthermore, this process for forming a diffused resistor requires than an n− implant step be performed, and hence is not as easily implemented when a non− LDD process is used to form the n-channel transistors.

Therefore, it is desirable to have an improved process for forming resistors for ESD protection, and other purposes.

SUMMARY OF THE INVENTION

I have invented a technique for making an integrated circuit, whereby a resistor is formed in a doped tub region. The resistor is defined by a masking layer that comprises a conductor level used to form the gate conductor of a transistor coupled to the resistor.

DETAILED DESCRIPTION

Figure 4:
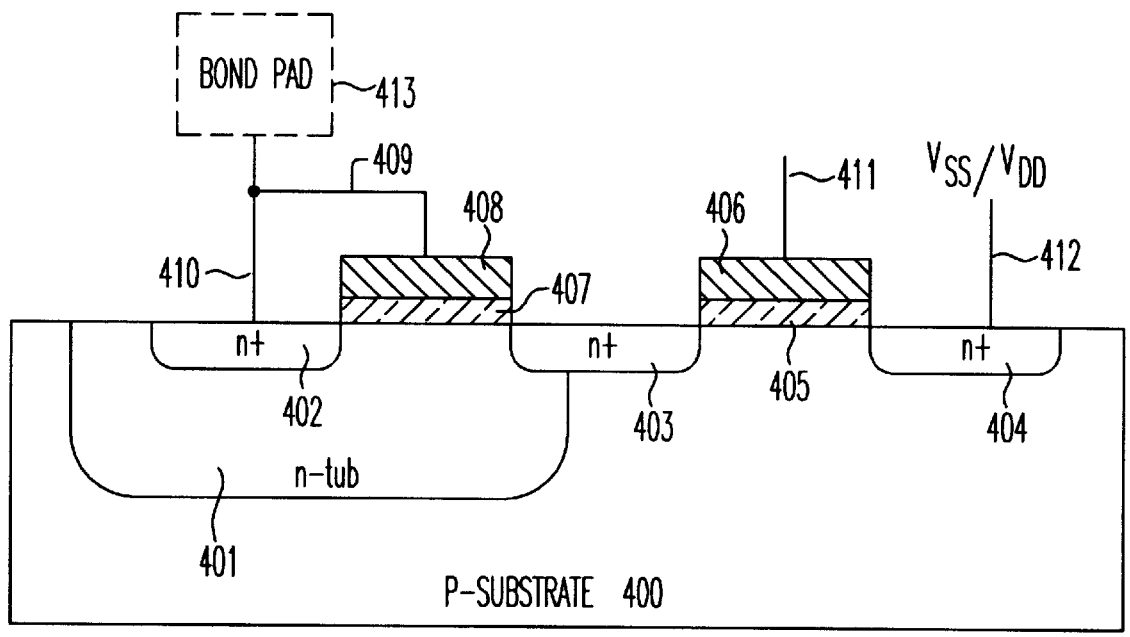
FIG. 4 shows a typical embodiment of the inventive technique.

The following detailed description relates to an integrated circuit technique for implementing a diffused resistor. Referring to FIG. 4, an illustrative embodiment of the present technique is shown, wherein an n-channel output transistor is connected to a bondpad 413 by means of the inventive diffused resistor technique. The output transistor is shown formed in p-substrate 400, but may alternatively be formed in a p-tub (sometimes referred to as a p-well in the art) that is formed in the p-substrate. The output transistor includes a gate conductor 406 located on a gate dielectric 405 that separate the n+ source region 404 and the n+ drain region 403. The gate conductor typically comprises doped polysilicon, which may optionally include a metal silicide layer. The use of a metal as the gate conductor is also possible. The drain electrode 403 is connected to the bondpad 413 by means of a resistor formed in the n-tub 401. The resistor is defined by the conductor region 408, referred to hereafter as the "resistor masking conductor". This serves as a mask to prevent the n-type dopants from being introduced into the substrate during the ion implantation (or other diffusion process) step that forms n+ doped regions 402, 403, and 404.

Therefore, the resistance between the drain region 403 and the tub contact region 402 will be largely determined by the size of resistor masking conductor 408 and the resistivity of the n-tub 401, which is significantly higher than the resistivity of the n+ doped regions. The resistance is also influenced by the voltage present on the electrodes (402, 403) of the resistor with respect to the substrate 400. The higher (more positive) this voltage, the more reverse-biased is the junction between the n-tub 401 and the p-substrate 400, causing the depletion region at this junction to increase, which tends to increase the resistance. However, this is partially offset by the accumulation of n-type carriers in the n-tub 401 directly under the conductor 408, which tends to decrease the resistance.

Figure 1:
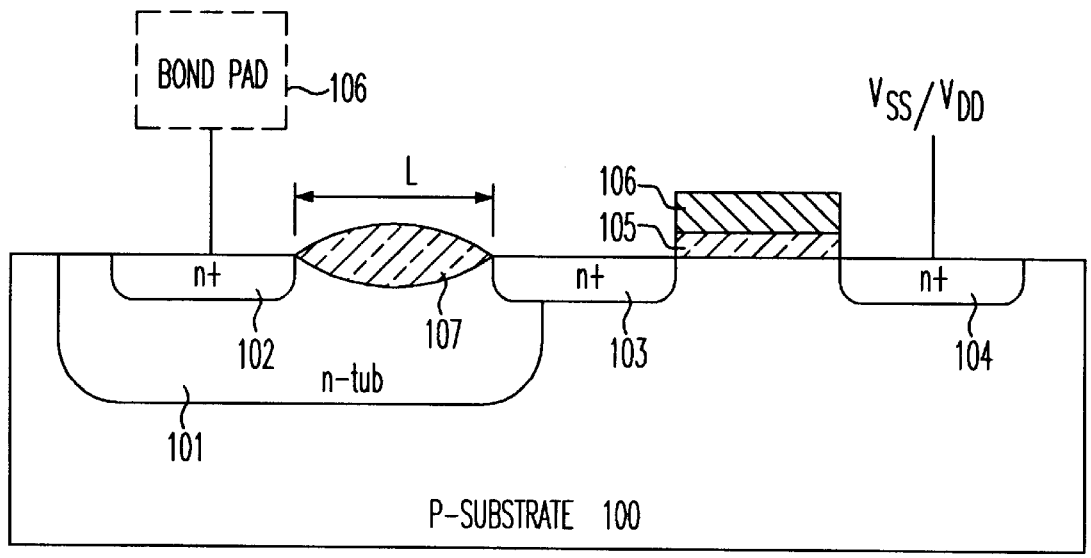
FIGS. 1 and 2 show prior-art processes for forming diffused output resistors.
Figure 2:
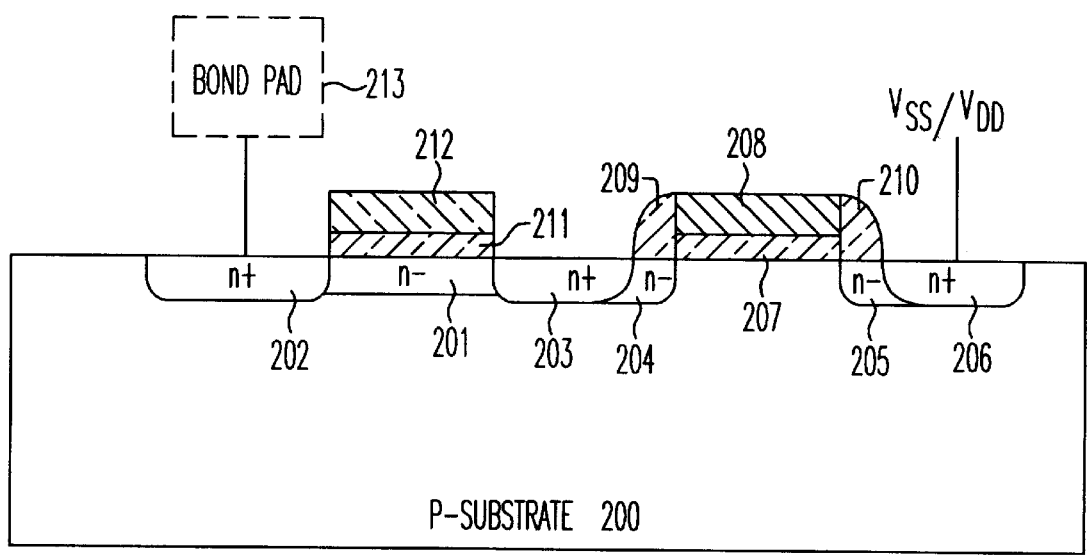

In the inventive technique, the resistor masking conductor 408 is formed from the same conductor layer that also forms the gate conductor 406. Similarly, the dielectric 407 is formed from the same dielectric layer that also forms the gate dielectric 405. Therefore, the same lithography step may be employed to define both the gate conductor 406 and the resistor masking conductor 408 (as well as the underlying dielectrics 405 and 406). This lithography step, and the subsequent etching operations, may be performed by a variety of techniques known in the semiconductor art. The inventive technique therefore has the advantage that the size of the resistor is typically well controlled, since the gate lithography and etching operations are usually well controlled in the integrated circuit fabrication process, in order to obtain the desired channel length. Furthermore, the length of the resistor masking conductor 408 may typically be made shorter than the minimum length of a field oxide region, as in FIG. 1. If desired, the resistor length may be the minimum lithographic dimension. Therefore, the size of the output buffer (including an output transistor and associated resistor) may be less when the resistor is formed by the inventive technique, as compared to the prior-art technique of FIG. 1. Furthermore, note that the inventive technique makes use of the doped tub (e.g., n-tub) that is normally present in many integrated circuit processes. Therefore, the present technique does not require an extra implant to form the LDD structure (as in FIG. 2), although use with the LDD structure is of course possible. Also, the inventive technique does not require the extra lithography step that is required to define the resistor in the technique of FIG. 2.

Figure 5:
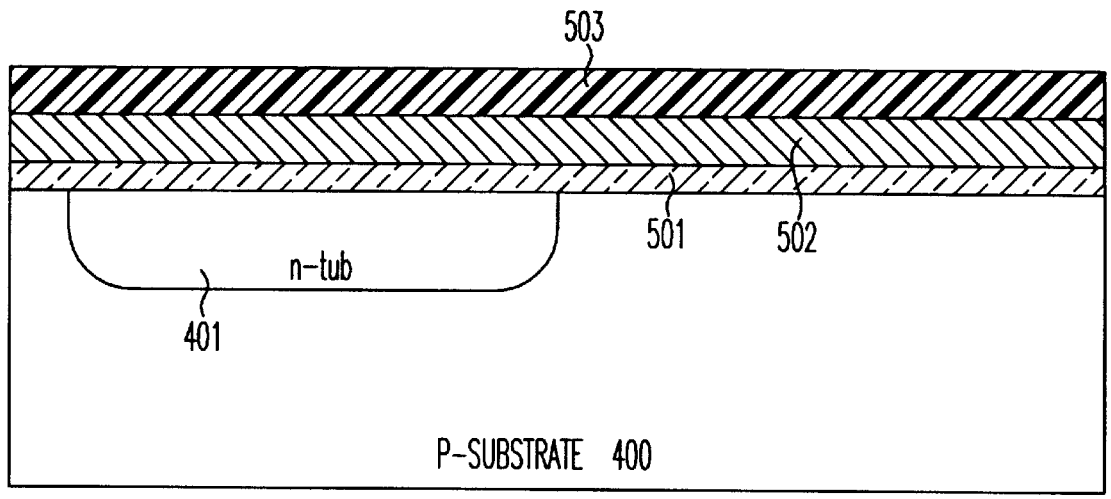
FIGS. 5 and 6 show typical process steps that may be used in practicing the inventive technique.
Figure 6:
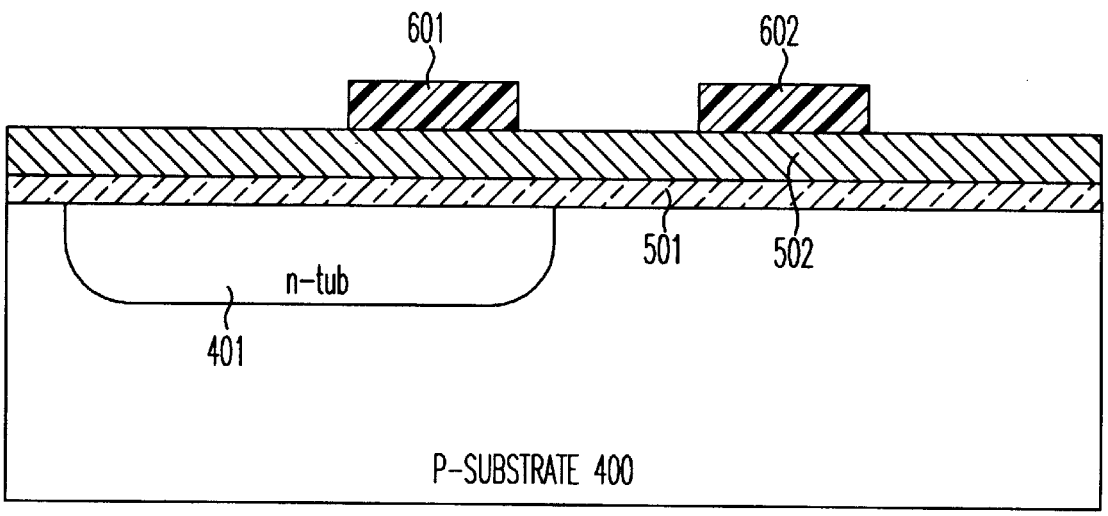

A sequence of operations that may be used in forming the inventive structure is shown in FIGS. 5 and 6. Referring to FIG. 5, the p-substrate 400 is shown with the n-tub 401 formed therein, which may be accomplished by conventional lithography, masking, and ion implantation processes known in the art. The thin dielectric region 501 is formed, typically by oxidation of the surface of a silicon substrate 400, although other dielectric-forming processes and materials are possible. Note that the thin dielectric region is required to serve as the gate dielectric in MOS (metal oxide silicon) types of transistors. However, it is not required in certain types of GaAs or other III-V semiconductor transistor structures, and its presence is optional insofar as practicing the present invention is concerned. The conductor layer 502 is formed to overlie the substrate and dielectric layer 501. The conductor layer typically comprises doped polysilicon or other materials noted above, and will serve to form the gate conductor. A layer of lithographic resist material 503 is deposited, and exposed by actinic radiation of a desired type (ultraviolet, X-ray, electron beam, etc.). Referring to FIG. 6, the resist material is developed by wet or dry development procedures as desired, leaving resist etch masking regions 601 and 602. An etching operation, typically anisotropic reactive ion etching, is used to transfer the pattern of the resist into the underlying layers 501 and 502, after which the resist etch masking regions 601 and 602 are removed.

The above-described procedure produces the isolated dielectric regions 405 and 407, and conductor regions 406 and 408 described above with respect to FIG. 4. An ion implant operation, or other dopant introduction process, is then used to form the n+ regions 402, 403 and 404 shown in FIG. 4. In forming these regions, it is desirable to space the edge of the n-tub 401 sufficiently far from the closest edge of gate conductor 406 to avoid counter-doping the p-substrate in the channel region under the gate. In one 0.9 micron process, a spacing of 1.5 microns has been found sufficient. Contact to the various electrodes is provided by conductors 409, 410, 411 and 412, which are shown schematically for simplicity of illustration. In a typical case, these conductors are aluminum that may be formed by techniques known in the art, but with other materials (e.g., a refractory metal, copper, metal silicides, and/or metal nitrides) being possible. It is usually desirable to connect the resistor masking conductor region 408 to a known voltage potential, to avoid a "floating gate" situation than could prevent the tub resistor from conducting properly. Therefore, the resistor masking conductor 408 is connected by conductor 409 to the bondpad 413 in the presently preferred embodiment. This embodiment also typically improves ESD performance by increasing the resistor value, due to the above-noted depletion effect, as the bondpad voltage rises during a positive ESD event. In addition, it helps avoid breakdown of the gate dielectric of the transistor protected. However, other methods of avoiding a floating gate are possible.

The resistance provided by the output resistor will depend on the size and resistivity of the n-tub 401, which depends on its doping level. Typical n– tub doping levels are in the range of from $10^{11}$ to $10^{13}$ dopant ions per $cm^2$ in silicon substrate material. This provides a resistivity range of typically from 400 to 5000 ohms per square. The dimensions (length and width) of the n-tub output resistor are typically about the same as those of the source or drain region to which it is connected, for convenience of layout, although it may be any desired size necessary to obtain the desired resistance. In one design implemented in 0.9 micron LDD technology, the n-tub sheet resistance is 3100 ohms per square, so that when the length of the resistor masking conductor 408 is 0.9 microns, the length of the resistor is slightly less (by about 0.2 microns), due to the phosphorus n– dopant diffusion. The overall resistance is the combination of a 0.7 micron long n-tub resistor and two approximately 0.3 micron long n– LDD resistors on either side of the n-tub resistor. This provides a resistance of about 2 ohms for a 1500 micron wide resistor to about 300 ohms for a 10 micron wide resistor, wherein the width is the dimension perpendicular to the length in the plane of the substrate surface. In most cases, resistor values in the range of 1 to 500 ohms will be suitable in practicing the present invention for ESD purposes.

Figure 3:
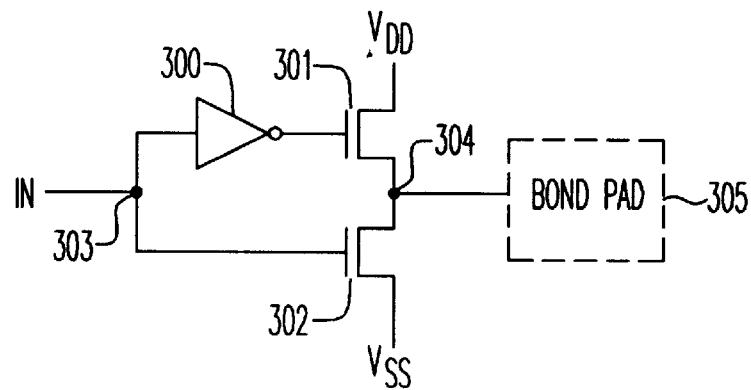
FIG. 3 shows one type of prior-art output buffer design.

Application of the inventive technique to a wide variety of output buffer designs is possible. One typical application is shown in FIG. 3, wherein a prior-art output buffer having both n-channel pull-up transistor 301 and n-channel pull-down transistor 302 is shown. The inverter 300 ensures that the transistor 301 is non-conducting when 302 is conducting, and vice-versa. This type of design is widely used in SCSI (Small Computer System Interface) designs. Both of the transistors 301 and 302 may advantageously be protected by output resistors between their source/drain electrodes and the output node 304, which is connected to bondpad 305. Note that still additional ESD protection in the form of diodes, transistors, or other voltage-clamping devices (not shown) is typically provided to obtain the desired degree of ESD protection. Other buffer types that may use the invention include a CMOS output stage, wherein a p-channel pull-up transistor and an n-channel pull-down transistor are used. An open-drain type of output stage may also use the invention, wherein an n-channel transistor serves as the pull-down device and an external resistor serves as the pull-up device.

Although no dielectric sidewall spacers are shown in the illustrative embodiment of FIG. 4, they may be included as desired. For example, sidewall spacers may be used to form the LDD structure shown in FIG. 2, or alternatively may be included to space the gate conductor from the source/drain electrodes without the LDD implanted regions. Such spacing may help prevent undesired electrical shorts between the gate and source/drain electrodes, as may occur when silicided electrodes are used, for example. It has been found by workers in the art that silicided electrodes may be more susceptible to ESD damage that other types, and hence the inventive technique may be especially advantageous in those cases. While the above illustrative embodiment has been shown for an n-channel output transistor, application of the inventive technique to the protection of a p-channel output transistor is possible by reversing the doping conductivity types shown, as will be apparent to persons of skill in the art.

While single source and drain regions are illustrated for convenience, typical output transistors have multiple source/drain regions controlled by a common gate conductor for improved output current capability, as is known in the art. The inventive technique may be used to form resistors for connection of each of the drain regions to the output bondpad. Also, the embodiment shown in FIG. 4 shows the drain of the n-channel transistor and one of the resistor contact electrodes sharing the same n+ doped region (403) for efficient layout. However, the drain of the transistor and the contact electrode of the resistor may be formed in separate n+ doped regions, and electrically connected together, as by a metal or other conductor layer. In some cases, the source of the output transistors is not directly connected to $V_{SS}$ or $V_{DD}$, as shown in FIG. 3, but may be connected through other transistors, as for speed control purposes or to reduce voltages to protect against breakdown. Furthermore, the inventive resistor may be connected to a bondpad through still another protective resistor of conventional type (e.g., doped polysilicon), or through another type of protective transistor (e.g., bipolar). In most cases, voltage-clamping diodes or transistors are also connected to the bondpad to provide improved ESD protection. The bondpad referred to herein carries at least the output signal, but may also carry one or more input signals time multiplexed with the output signal, in which case the bondpad is usually referred to as an input/output (I/O bondpad).

While the above description has been in terms of improved ESD performance, other advantageous uses for a resistor formed by the inventive technique are possible. For example, the resistor may be used for improved electrical overstressing protection. Also, connection of the inventive resistor to a circuit conductor other than an output conductor connected to a bondpad is possible, and included herein. The transistor coupled to the resistor may perform a function other than as an output transistor in an output buffer, while still obtaining benefits by the use of the inventive technique.

I claim:

1. An integrated circuit including a field effect transistor having a gate conductor formed from a conductor layer overlying a semiconductor body, and having a source/drain region of a given conductivity type that is coupled to a circuit conductor through a resistor, characterized in that said resistor is formed in a tub region of said given conductivity type, with said tub region being connected to said circuit conductor by means of a heavily doped contact region of said given conductivity type that is formed in said tub region;

and wherein said resistor underlies a resistor masking conductor formed from said conductor layer, whereby the size of said resistor is defined by said resistor masking conductor.

2. The integrated circuit of claim 1 wherein said resistor masking conductor is connected to said circuit conductor.

3. The integrated circuit of claim 2 wherein said circuit conductor is an output conductor connected to a bondpad.

4. The integrated circuit of claim 1 wherein said field effect transistor is a MOS field effect transistor that includes a gate dielectric formed from a first portion of a thin dielectric layer, and wherein a second portion of said thin dielectric layer underlies said resistor masking conductor.

5. The integrated circuit of claim 4 wherein said given conductivity type is n-type, and said field effect transistor is an n-channel field effect transistor.

6. The integrated circuit of claim 5 wherein said field effect transistor is an output transistor, and said circuit conductor is an output conductor connected to a bondpad.

* * * * *